(12) United States Patent
Karda et al.

(10) Patent No.: US 12,725,657 B2
(45) Date of Patent: Sep. 1, 2026

(54) MEMORY DEVICE HAVING TIERS OF MEMORY CELLS AND ACCESS LINE HAVING MULTIPLE CONDUCTIVE REGIONS

(71) Applicant: Micron Technology, Inc., Boise, ID (US)

(72) Inventors: Kamal M. Karda, Boise, ID (US); Si-Woo Lee, Saratoga, CA (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 368 days.

(21) Appl. No.: 18/435,434

(22) Filed: Feb. 7, 2024

(65) Prior Publication Data

US 2024/0274194 A1 Aug. 15, 2024

Related U.S. Application Data

(60) Provisional application No. 63/444,464, filed on Feb. 9, 2023.

(51) Int. Cl.
*G11C 16/04* (2006.01)
*G11C 5/06* (2006.01)
*H10B 41/27* (2023.01)

(52) U.S. Cl.
CPC .......... *G11C 16/0483* (2013.01); *G11C 5/063* (2013.01); *H10B 41/27* (2023.02)

(58) Field of Classification Search
None
See application file for complete search history.

(56) References Cited

U.S. PATENT DOCUMENTS

2012/0300546 A1* 11/2012 Tessariol ................ G11C 16/10 257/314
2014/0321188 A1* 10/2014 Tanzawa .................. G11C 5/06 365/63
2016/0172041 A1* 6/2016 Sakui ..................... G11C 16/30 365/185.12
2019/0066762 A1* 2/2019 Koya .................. G11C 11/4087

* cited by examiner

*Primary Examiner* — Evren Seven
(74) *Attorney, Agent, or Firm* — Schwegman Lundberg & Woessner, P.A.

(57) ABSTRACT

Some embodiments include apparatuses in which one of the apparatuses includes a first conductive structure, a second conductive structure, a third conductive structure, and a memory cell. The memory cell includes a semiconductor portion located on a first level of the apparatus and coupled to the first conductive structure, and a charge storage structure located on the first level coupled to the semiconductor portion and separated from the second conductive structure. The third conductive structure is located on a second level of the apparatus adjacent the semiconductor portion, and including first, second, and third conductive regions. The third conductive region is located between the first and second conductive regions and has a material different from a material of the first conductive region and a material of the second conductive region.

20 Claims, 10 Drawing Sheets

X
Y
762
299
BLD
BLG
725
752
749T
WLi
751
797
PLT1
PLT2
741T
WL1
210
761
BL1
BL2
200

702
797'
715
720
200

702
702A
702I
702B
702C
X
Y
Z 299
210
720
702
715
797
797'

MEMORY DEVICE HAVING TIERS OF MEMORY CELLS AND ACCESS LINE HAVING MULTIPLE CONDUCTIVE REGIONS

PRIORITY APPLICATION

This application claims the benefit of priority to U.S. Provisional Application Ser. No. 63/444,464, filed Feb. 9, 2023, which is incorporated herein by reference in its entirety.

BACKGROUND

Memory devices are widely used in computers and many other electronic items to store information. Memory devices are generally categorized into two types: volatile memory devices and non-volatile memory devices. A memory device usually has numerous memory cells to store information. In a volatile memory device, information stored in the memory cells is lost if power supply is disconnected from the memory device. In a non-volatile memory device, information stored in the memory cells is retained even if power supply is disconnected from the memory device.

The description herein involves volatile memory devices. As demand for device storage density increases, many conventional techniques provide ways to shrink the size of the memory cell in order to increase device storage density for a given device area. However, physical limitations and fabrication constraints may pose a challenge to such conventional techniques if the memory cell size is to be shrunk to a certain dimension. Further, such conventional techniques may still face limitations in controlling current associated with the memory cells during memory operations.

DETAILED DESCRIPTION

The memory device described herein includes a volatile memory device that has tiers of memory cells in which the tiers are stacked one over another over a substrate (e.g., a semiconductor substrate) of the memory device. The described memory device includes data lines (e.g., bit lines) that can include conductive structures extending through the tiers (e.g., extending vertically). The memory cells of different tiers can share the conductive structures of the data lines (e.g., vertical data lines). The described memory device includes access lines (e.g., word lines) associated with memory cells of respective tiers. The access lines can extend in a direction (e.g., extend horizontally) perpendicular to the data lines (e.g., vertical data line). Each access line can include a conductive structure having different conductive regions on the same level (lateral conductive regions) of the memory device. The conductive regions can have different conductive materials with different work functions. The described memory device includes common conductive structures in addition to the conductive structures of the data lines and the access lines. The common conductive structures can also extend through the tiers (e.g., extending vertically). Memory cells that are associated with different access lines (e.g., word lines) can share a common conductive structure. The common conductive structures can be applied with different voltages during read and write operations of the memory device. Alternatively, the common conductive structures can also be part of a ground connection (e.g., ground plate) of the memory device.

Improvements and benefits of the described memory device include improved device area efficiency, reduced capacitive coupling between adjacent data lines, reduced total capacitance associated with the data lines, and more selections for materials of the transistors. Further, the different conductive regions of the structure of the access line can improve the range of current associated with memory operation of the memory device. In addition, the tier structure of the described memory device can also improve (e.g., reduce) cost per bit of the memory device. Other improvements and benefits of the described memory device and its variations are discussed below with reference to FIG. 1 through FIG. 7F.

Figure 1:
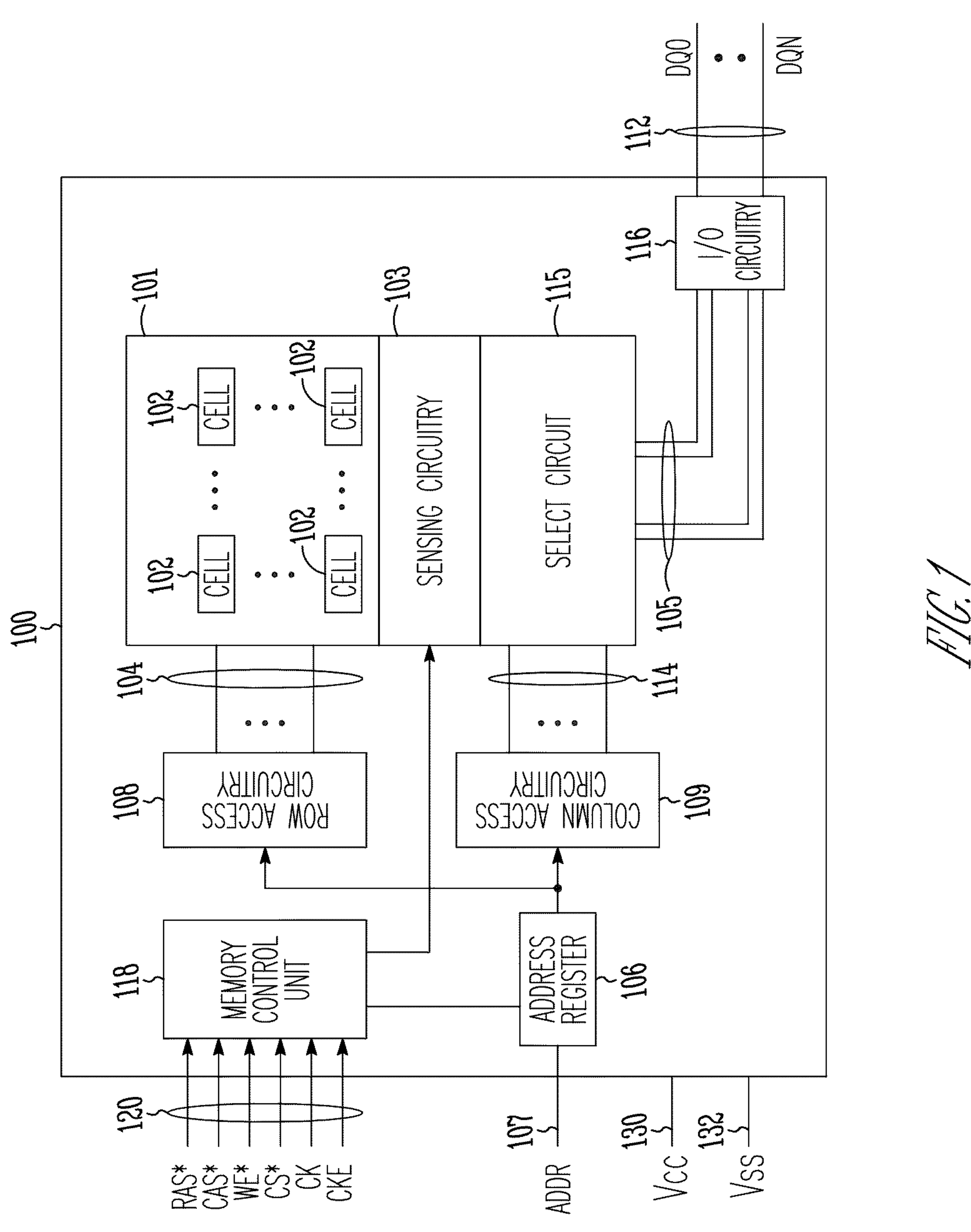
FIG. 1 shows a block diagram of an apparatus in the form of a memory device including volatile memory cells, according to some embodiments described herein.

FIG. 1 shows a block diagram of an apparatus in the form of a memory device 100 including volatile memory cells, according to some embodiments described herein. Memory device 100 includes a memory array 101, which can contain memory cells 102. Memory device 100 can include a volatile memory device such that memory cells 102 can be volatile memory cells. An example of memory device 100 includes a dynamic random-access memory (DRAM) device. Information stored in memory cells 102 of memory device 100 may be lost (e.g., invalid) if power supply (e.g., supply voltage Vcc) is disconnected from memory device 100. Hereinafter, supply voltage Vcc is referred to as representing some voltage levels; however, they are not limited to a supply voltage (e.g., Vcc) of the memory device (e.g., memory device 100). For example, if the memory device (e.g., memory device 100) has an internal voltage generator (not shown in FIG. 1) that generates an internal voltage based on supply voltage Vcc, such an internal voltage may be used instead of supply voltage Vcc.

The physical structure of memory device 100 can include multiple levels (e.g., multiple tiers) of memory cells where one level (e.g., one tier) of memory cells can be formed over (e.g., stacked on) another level (e.g., another tier) of additional memory cells. The structure of memory array 101, including memory cells 102, can include the structure of memory arrays and memory cells described below with reference to FIG. 2 through FIG. 7F.

As shown in FIG. 1, memory device 100 can include access lines 104 (e.g., "word lines") and data lines (e.g., bit lines) 105. Memory device 100 can use signals (e.g., word line signals) on access lines 104 to access memory cells 102 and data lines 105 to provide information (e.g., data) to be stored in (e.g., written) or read (e.g., sensed) from memory cells 102.

Memory device 100 can include an address register 106 to receive address information ADDR (e.g., row address signals and column address signals) on lines 107 (e.g., address lines). Memory device 100 can include row access circuitry 108 (e.g., X-decoder) and column access circuitry 109 (e.g., Y-decoder) that can operate to decode address information ADDR from address register 106. Based on decoded address information, memory device 100 can determine which memory cells 102 are to be accessed during a memory operation. Memory device 100 can perform a write operation to store information in memory cells 102 and a read operation to read (e.g., sense) information (e.g., previously stored information) in memory cells 102. Memory device 100 can also perform an operation (e.g., a refresh operation) to refresh (e.g., to keep valid) the value of information stored in memory cells 102. Each of memory cells 102 can be configured to store information that can represent at most one bit (e.g., a single bit having a binary 0 ("0") or a binary 1 ("1"), or more than one bit (e.g., multiple bits having a combination of at least two binary bits).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating current to direct current (AC-DC) converter circuitry.

As shown in FIG. 1, memory device 100 can include a memory control unit 118, which includes circuitry (e.g., hardware components) to control memory operations (e.g., read and write operations) of memory device 100 based on control signals on lines (e.g., control lines) 120. Examples of signals on lines 120 include a row access strobe signal RAS*, a column access strobe signal CAS*, a write-enable signal WE*, a chip select signal CS*, a clock signal CK, and a clock-enable signal CKE. These signals can be part of signals provided to a DRAM device.

As shown in FIG. 1, memory device 100 can include lines (e.g., global data lines) 112 that can carry signals DQ0 through DQN. In a read operation, the value (e.g., "0" or "1") of information (read from memory cells 102) provided to lines 112 (in the form of signals DQ0 through DQN) can be based on the values of the signals on data lines 105. In a write operation, the value (e.g., "0" or "1") of information provided to data lines 105 (to be stored in memory cells 102) can be based on the values of signals DQ0 through DQN on lines 112.

Memory device 100 can include sensing circuitry 103, select circuitry 115, and input/output (I/O) circuitry 116. Column access circuitry 109 can selectively activate signals on lines (e.g., select lines) based on address signals ADDR. Select circuitry 115 can respond to the signals on lines 114 to select signals on data lines 105. The signals on data lines 105 can represent the values of information to be stored in memory cells 102 (e.g., during a write operation) or the values of information read (e.g., sensed) from memory cells 102 (e.g., during a read operation).

I/O circuitry 116 can operate to provide information read from memory cells 102 to lines 112 (e.g., during a read operation) and to provide information from lines 112 (e.g., provided by an external device) to data lines 105 to be stored in memory cells 102 (e.g., during a write operation). Lines 112 can include nodes within memory device 100 or pins (or solder balls) on a package where memory device 100 can reside. Other devices external to memory device 100 (e.g., a hardware memory controller or a hardware processor) can communicate with memory device 100 through lines 107, 112, and 120.

Memory device 100 may include other components, which are not shown in FIG. 1 so as not to obscure the example embodiments described herein. At least a portion of memory device 100 (e.g., a portion of memory array 101) can include structures and operations similar to or the same as any of the memory devices described below with reference to FIG. 2 through FIG. 7F.

Figure 2:
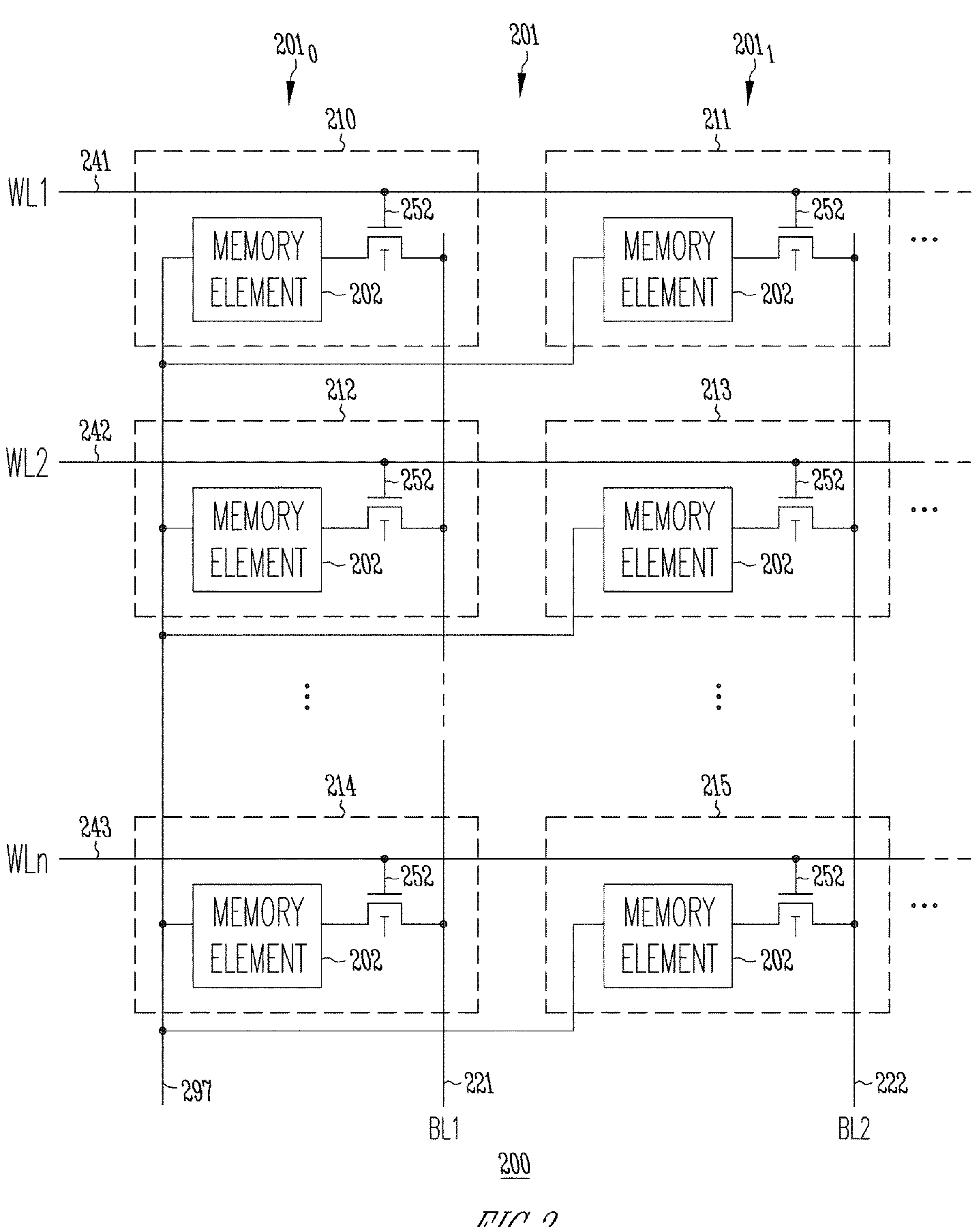
FIG. 2 shows a schematic diagram of a portion of a memory device including a memory array and memory cells, according to some embodiments described herein.

FIG. 2 shows a schematic diagram of a portion of a memory device 200 including a memory array 201, according to some embodiments described herein. Memory device 200 can correspond to memory device 100 of FIG. 1. For example, memory array 201 can form part of memory array 101 of FIG. 1. As shown in FIG. 2, memory device 200 can include memory cells 210 through 215, which are volatile memory cells (e.g., DRAM cells). For simplicity, similar or identical elements among memory cells 210 through 215 are given the same labels.

Each of memory cells 210 through 215 can include a transistor T and a memory element 202. Transistor T can include a field-effect transistor (FET). As an example, transistor can be n-channel FET (NFET), such that part transistor T can include a structure of an n-channel metal-oxide semiconductor (NMOS). Thus, in an example, transistor T can include an operation similar to that of a NMOS transistor. In another example, transistor T can be another type of transistor.

Memory element 202 of each of memory cells 210 through 215 can be configured to store information. For example, memory element 202 can include a charge storage structure. In an example, the charge storage structure can be part of a capacitor (e.g., part of a plate of a capacitor).

Memory element 202 can be in state "0" when information having a value of "0" is stored in memory element 202. Memory element 202 can be in state "1" when information having a value of "1" is stored in memory element 202.

Memory element 202 can store charge (e.g., store charge in its charge storage structure). The value (e.g., "0" or "1") of information stored in a particular memory cell among memory cells 210 through 215 can be based on the amount of charge in memory element 202 of that particular memory cell. For example, the value of information stored in a particular memory cell among memory cells 210 through 215 can be "0" or "1" (if each memory cell is configured as a single-bit memory cell) or "00," "01," "10," "11" (or other multi-bit values) if each memory cell is configured as a multi-bit memory cell.

As shown in FIG. 2, transistor T (e.g., the channel region of transistor T) of a particular memory cell among memory cells 210 through 215 can be electrically coupled to (e.g., directly coupled to (contact)) memory element 202 of that particular memory cell. Thus, a circuit path (e.g., current path) can be formed directly between transistor T of a particular memory cell and memory element 202 of that particular memory cell during an operation (e.g., a read or write operation) of memory device 200. During an operation (e.g., a read or write operation) of memory device 200, a circuit path (e.g., current path) can be formed between a respective data line (e.g., data line 221 or 222) and memory element 202 of a particular memory cell through transistor T (e.g., through the channel region of transistor T) of the particular memory cell.

Memory cells 210 through 215 can be arranged in memory cell groups $\mathbf{201}_0$ and $\mathbf{201}_1$. FIG. 2 shows two memory cell groups (e.g., $\mathbf{201}_0$ and $\mathbf{201}_1$) as an example. However, memory device 200 can include more than two memory cell groups. Memory cell groups $\mathbf{201}_0$ and $\mathbf{201}_1$ can include the same number of memory cells. For example, memory cell group $\mathbf{201}_0$ can include memory cells 210, 212, and 214, and memory cell group $\mathbf{201}_1$ can include memory cells 211, 213, and 215. FIG. 2 shows three memory cells in each of memory cell groups $\mathbf{201}_0$ and $\mathbf{201}_1$ as an example. The number of memory cells in memory cell groups $\mathbf{201}_0$ and $\mathbf{201}_1$ can be different from three.

Memory device 200 can perform a write operation to store information in memory cells 210 through 215, and a read operation to read (e.g., sense) information from memory cells 210 through 215. Memory device 200 can be configured to operate as a DRAM device. During an operation (e.g., a read or write operation) of memory device 200, an access line (e.g., a single access line) and a data line (e.g., a single data line) can be used to access a selected memory cell (e.g., target memory cell).

As shown in FIG. 2, memory device 200 can include access lines (e.g., word lines) 241, 242, and 243 that can carry respective signals (e.g., word line signals) WL1, WL2, and WLn. Access lines 241, 242, and 243 can be used to access both memory cell groups $\mathbf{201}_0$ and $\mathbf{201}_1$. In the physical structure of memory device 200, each of access lines 241, 242, and 243 can be structured as (can be formed from) one conductive line (e.g., conductive structure) or multiple conductive lines (e.g., multiple conductive structures). The multiple conductive lines of each access line can be electrically coupled (e.g., shorted) to each other.

Access lines 241, 242, and 243 can be selectively activated (e.g., activated one at a time) during an operation (e.g., read or write operation) of memory device 200 to access a selected memory cell (or selected memory cells) among memory cells 210 through 215. A selected memory cell can be referred to as a target memory cell. In a read operation, information can be read from a selected memory cell (or selected memory cells). In a write operation, information can be stored in a selected memory cell (or selected memory cells).

As shown in FIG. 2 transistor T can have a gate 252, which can be part of a respective access line (e.g., a respective word line). For example, gate 252 of transistor T of memory cell 210 can be part of access line 241. Gate 252 transistor T of memory cell 211 can be part of access line 241. In the physical structure of memory device 200, two different portions of a conductive material (e.g., two different portions of a continuous piece of metal or polysilicon) that forms access line 241 can form two respective gates, which include gate 252 of transistor T of memory cell 210 and gate 252 of transistor T of memory cell 211.

Similarly, two different portions of a conductive material (e.g., two different portions of a continuous piece of metal or polysilicon) that forms access line 242 can form two respective gates, which include gate 252 of transistor T of memory cell 212 and gate 252 of transistor T of memory cell 213. Likewise, two different portions of a conductive material (e.g., two different portions of a continuous piece of metal or polysilicon) that forms access line 243 can form two respective gates, which include gate 252 of transistor T of memory cell 214 and gate 252 of transistor T of memory cell 215.

In this description, a material can include a single material or a combination of multiple materials. A conductive material can include a single conductive material or a combination of multiple conductive materials.

As shown in FIG. 2, memory device 200 can include data lines (e.g., bit lines) 221 and 222 that can carry respective signals (e.g., bit line signals) BL1 and BL2. During a read operation, memory device 200 can use data line 221 to obtain information read (e.g., sensed) from a selected memory cell of memory cell group $\mathbf{201}_0$, and data line 222 to read information from a selected memory cell of memory cell group $\mathbf{201}_1$. During a write operation, memory device 200 can use data line 221 to provide information to be stored in a selected memory cell of memory cell group $\mathbf{201}_0$, and data line 222 to provide information to be stored in a selected memory cell of memory cell group $\mathbf{201}_1$.

Memory device 200 can include a connection 297 coupled to memory cells 210 through 215. Connection 297 can be coupled to a voltage (e.g., a non-ground voltage) during an operation (e.g., read or write operation) of memory device 200. Alternatively, connection 297 can be coupled to ground or can be part of a ground connection of memory device 200. As shown in FIG. 2, connection 297 can be shared by memory cells 210 through 215. For example, connection 297 can include or can be part of a common conductive region (e.g., conductive plate) that can be shared by memory cells 210 through 215. In an example, memory element 202 can include a charge storage structure (e.g., a charge storage structure 702 in FIG. 7A) that is capacitively coupled to connection 297. Sharing connection 297 among memory cells 210 through 215, as shown in FIG. 2, can reduce capacitance (e.g., plate capacitance) of conductive structures that form (or that are part of) connection 297. FIG. 2 shows a connection 297 common to (e.g., coupled to) memory cells 210 through 215 as an example. However, connection 297 can be coupled to memory cells 210 through 215 in a different way.

Figure 3:
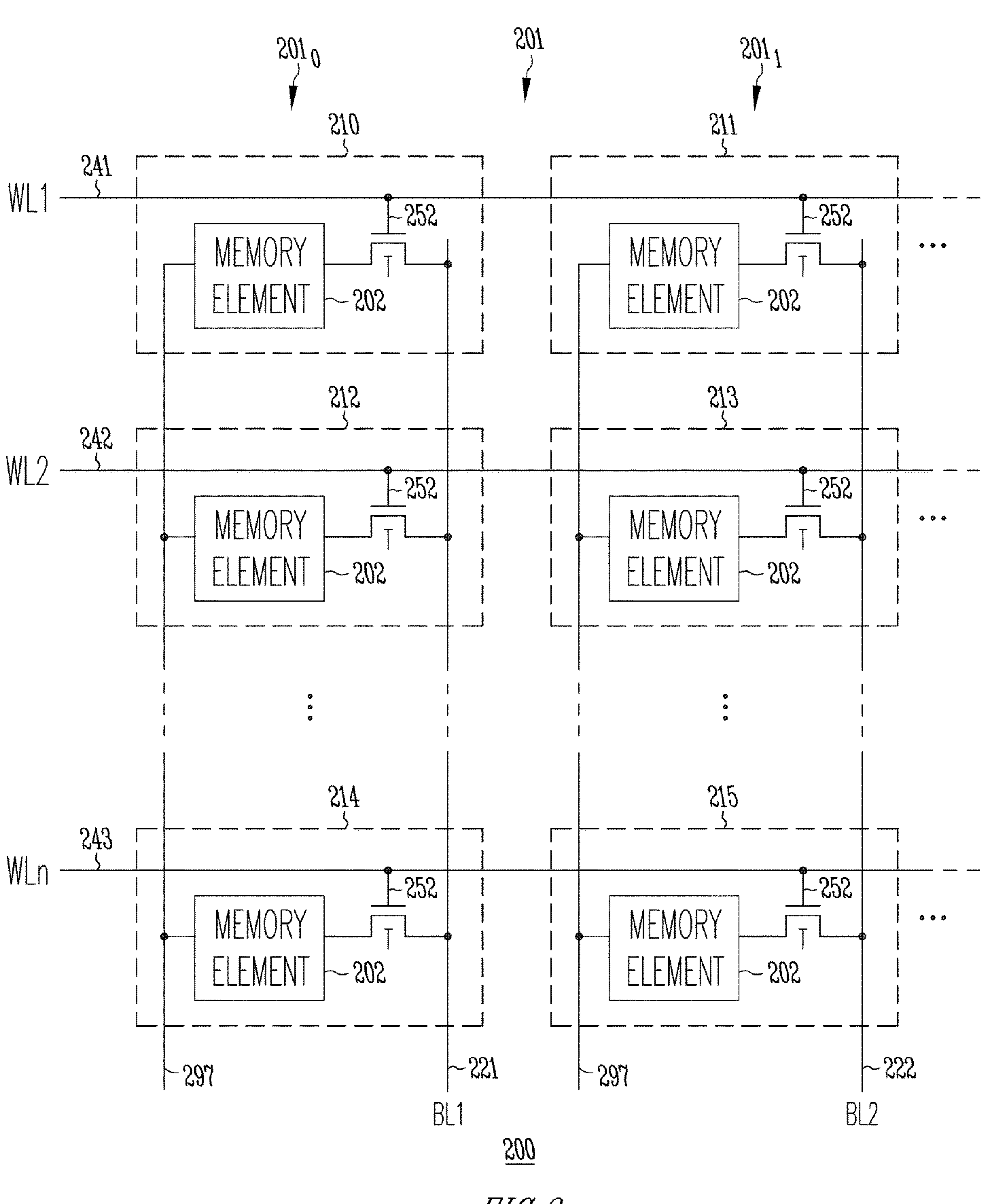
FIG. 3 shows a variation of the memory device of FIG. 2, according to some embodiments described herein.

FIG. 3 shows an example where connection 297 can include different conductive portions in which each conductive portion can be structured as a conductive line (e.g., a line (or layer) of conductive material) or alternatively a conductive plate (e.g., a layer of conductive material). As shown in FIG. 3, a different portion of connection 297 can be shared by memory cells that are associated with different access lines (e.g., word lines). For example, a portion of connection 297 can be shared by memory cells 210, 212, and 214 that are associated with access lines 241, 242, and 243, respectively. In another example, another portion of connection 297 can be shared by memory cells 211, 213, and 215 that are associated with access lines 241, 242, and 243, respectively. Alternatively, memory cells associated with different access lines can have their own portion of connection 297. For example, memory cells 210 and 211 associated with access line 241 can be coupled to a portion of connection 297 (not shown in FIG. 3) that is not shared by memory cells (e.g., memory cells 212, 213, 214, and 215) associated with other access lines (e.g., access lines 242 and 243). In another example, memory cells 212 and 213 associated with access line 242 can be coupled to a portion of connection 297 (not shown in FIG. 3) that is not shared by memory cells (e.g., memory cells 210, 211, 214, and 215) associated with other access lines (e.g., access lines 241 and 243). In another example, memory cells 214 and 215 associated with access line 243 can be coupled to a portion of connection 297 (not shown in FIG. 3) that is not shared by memory cells (e.g., memory cells 210, 211, 212, and 213) associated with other access lines (e.g., access lines 241 and 242). Thus, memory cells associated with access lines 241, 242, and 243 can be coupled to separated portions (e.g., three separate portions, not shown in FIG. 3) of connection 297.

Memory device 200 can include read paths (e.g., circuit paths). Information read from a selected memory cell during a read operation can be obtained through a read path coupled to the selected memory cell. In memory cell group $\mathbf{201}_0$, a read path of a particular memory cell (e.g., memory cell 210, 212, or 214) can include a current path (e.g., read current path) through a channel region of transistor T of that particular memory cell and data line 221. In memory cell group $\mathbf{201}_1$, a read path of a particular memory cell (e.g., memory cell 211, 213, or 215) can include a current path (e.g., read current path) through a channel region of transistor T of that particular memory cell and data line 222.

Memory device 200 can include write paths (e.g., circuit paths). Information to be stored in a selected memory cell during a write operation can be provided to the selected memory cell through a write path coupled to the selected memory cell. In memory cell group $\mathbf{201}_0$, a write path of a particular memory cell (e.g., memory cell 210, 212, or 214) can include a current path (e.g., a write current path) through a channel region of transistor T of that particular memory cell and data line 221. In memory cell group $\mathbf{201}_1$, a write path of a particular memory cell (e.g., memory cell 211, 213, or 215) can include a current path (e.g., a write current path) through a channel region of transistor T of that particular memory cell and data line 222.

During a read operation of memory device 200, only one memory cell of the same memory cell group can be selected one at a time to read information from the selected memory cell. For example, memory cells 210, 212, and 214 of memory cell group $\mathbf{201}_0$ can be selected one at a time during a read operation to read information from the selected memory cell (e.g., one of memory cells 210, 212, and 214 in this example). In another example, memory cells 211, 213, and 215 of memory cell group $\mathbf{201}_1$ can be selected one at a time during a read operation to read information from the selected memory cell (e.g., one of memory cells 211, 213, and 215 in this example).

During a read operation, memory cells of different memory cell groups (e.g., memory cell groups $\mathbf{201}_0$ and $\mathbf{201}_1$) that share the same access line (e.g., access line 241, 242, or 243) can be concurrently selected (or alternatively can be sequentially selected). For example, memory cells 210 and 211 can be concurrently selected during a read operation to read (e.g., concurrently read) information from memory cells 210 and 211. Memory cells 212 and 213 can be concurrently selected during a read operation to read (e.g., concurrently read) information from memory cells 212 and 213. Memory cells 214 and 215 can be concurrently selected during a read operation to read (e.g., concurrently read) information from memory cells 214 and 215.

The value of information read from the selected memory cell of memory cell group $\mathbf{201}_0$ during a read operation can be determined based on the value of a current detected (e.g., sensed) from a read path (described above) that includes data line 221 and transistor T of the selected memory cell (e.g., memory cell 210, 212, or 214). The value of information read from the selected memory cell of memory cell group $\mathbf{201}_1$ during a read operation can be determined based on the value of a current detected (e.g., sensed) from a read path that includes data line 222 and transistor T of the selected memory cell (e.g., memory cell 211, 213, or 215).

Memory device 200 can include detection circuitry (not shown) that can operate during a read operation to detect (e.g., sense) a current (e.g., current I1, not shown) on a read path that includes data line 221, and detect a current (e.g., current I2, not shown) on a read path that includes data line 222. The value of the detected current can be based on the value of information stored in the selected memory cell. For example, depending on the value of information stored in the selected memory cell of memory cell group $\mathbf{201}_0$, the value of the detected current (e.g., the value of current I1) on data line 221 can be zero or greater than zero. Similarly, depending on the value of information stored in the selected memory cell of memory cell group $\mathbf{201}_1$, the value of the detected current (e.g., the value of current I2) on data line 222 can be zero or greater than zero. Memory device 200 can include circuitry (not shown) to translate the value of a detected current into the value (e.g., "0", "1", or a combination of multi-bit values) of information stored in the selected memory cell.

During a write operation of memory device 200, only one memory cell of the same memory cell group can be selected at a time to store information in the selected memory cell. For example, memory cells 210, 212, and 214 of memory cell group $\mathbf{201}_0$ can be selected one at a time during a write operation to store information in the selected memory cell (e.g., one of memory cell 210, 212, and 214 in this example). In another example, memory cells 211, 213, and 215 of memory cell group $\mathbf{201}_1$ can be selected one at a time during a write operation to store information in the selected memory cell (e.g., one of memory cell 211, 213, and 215 in this example).

During a write operation, memory cells of different memory cell groups (e.g., memory cell groups $\mathbf{201}_0$ and $\mathbf{201}_1$) that share the same access line (e.g., access line 241, 242, or 243) can be concurrently selected. For example, memory cells 210 and 211 can be concurrently selected during a write operation to store (e.g., concurrently store) information in memory cells 210 and 211. Memory cells 212 and 213 can be concurrently selected during a write operation to store (e.g., concurrently store) information in memory cells 212 and 213. Memory cells 214 and 215 can be concurrently selected during a write operation to store (e.g., concurrently store) information in memory cells 214 and 215.

Information to be stored in a selected memory cell of memory cell group $\mathbf{201}_0$ during a write operation can be provided through a write path (described above) that includes data line 221 and transistor T of the selected memory cell (e.g., memory cell 210, 212, or 214). Information to be stored in a selected memory cell of memory cell group $\mathbf{201}_1$ during a write operation can be provided through a write path (described above) that includes data line 222 and transistor T of the selected memory cell (e.g., memory cell 211, 213, or 215). As described above, the value (e.g., binary value) of information stored in a particular memory cell among memory cells 210 through 215 can be based on the amount of charge in memory element 202 of that particular memory cell.

In a write operation, the amount of charge in memory element 202 of a selected memory cell can be changed (to reflect the value of information stored in the selected memory cell) by applying a voltage on a write path that includes transistor T of that particular memory cell and the data line (e.g., data line 221 or 222) coupled to that particular memory cell. For example, a voltage having one value (e.g., 0V) can be applied on data line 221 (e.g., provide 0V to signal BL1) if information to be stored in a selected memory cell among memory cells 210, 212, and 214 has one value (e.g., "0"). In another example, a voltage having another value (e.g., a positive voltage) can be applied on data line 221 (e.g., provide a positive voltage to signal BL1) if information to be stored in a selected memory cell among memory cells 210, 212, and 214 has another value (e.g., "1"). Thus, information can be stored (e.g., directly stored) in memory element 202 of a particular memory cell by providing the information to be stored (e.g., in the form of a voltage) on a write path (that includes transistor T) of that particular memory cell.

Figure 4:
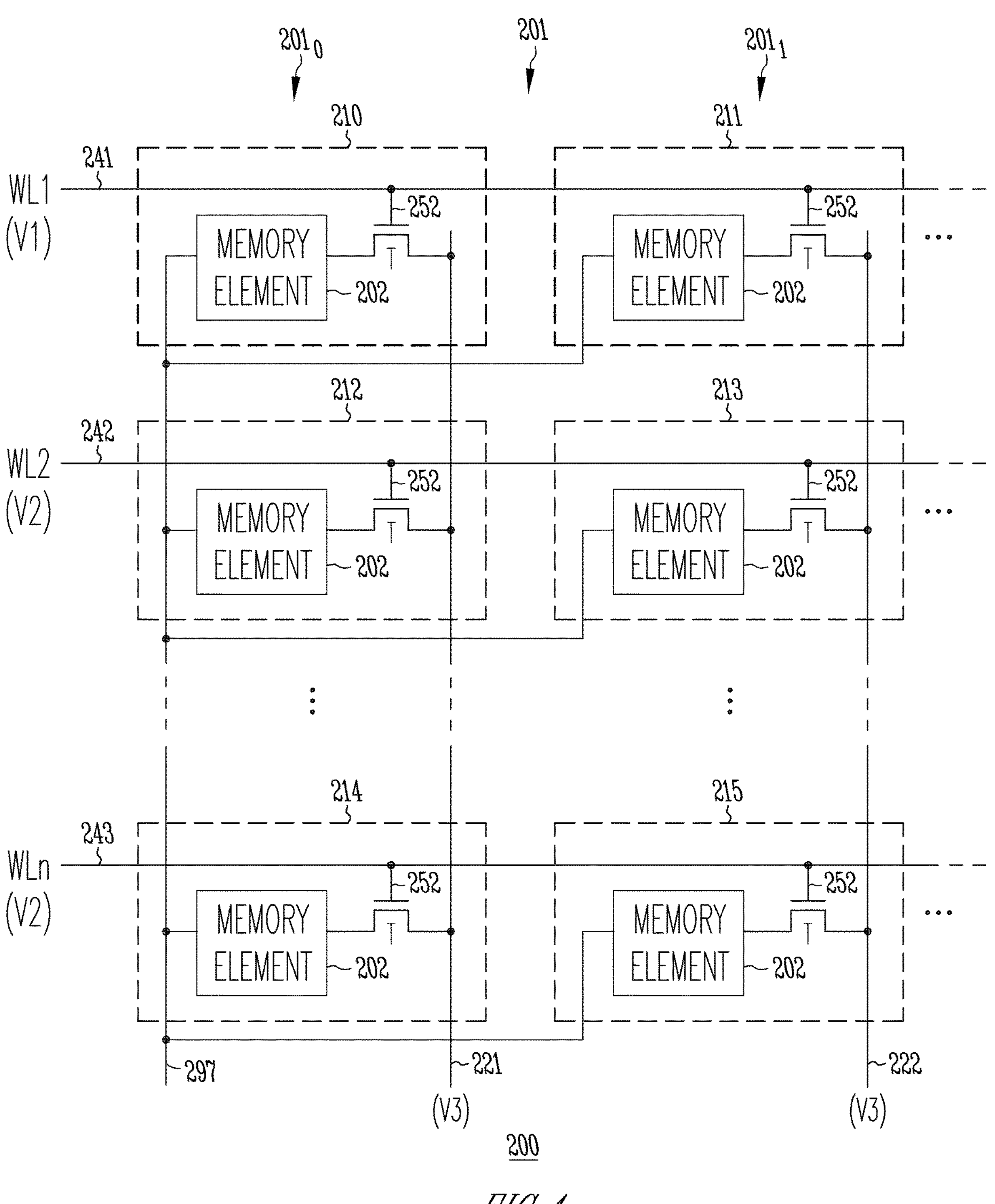
FIG. 4 shows the memory device of FIG. 2, including example voltages used during a read operation of the memory device, according to some embodiments described herein.

FIG. 4 shows memory device 200 of FIG. 2 including example voltages V1, V2, and V3 used during a read operation of memory device 200, according to some embodiments described herein. The example of FIG. 4 assumes that memory cells 210 and 211 are selected memory cells (e.g., target memory cells) during a read operation to read (e.g., to sense) information stored (e.g., previously stored) in memory cells 210 and 211. Memory cells 212 through 215 are assumed to be unselected memory cells. This means that memory cells 212 through 215 are not accessed, and information stored in memory cells 212 through 215 is not read while information is read from memory cells 210 and 211 in the example of FIG. 4. In this example, access line 241 can be called a selected access line (e.g., selected word line), which is the access line associated with (e.g., coupled to) selected memory cells (e.g., memory cells 210 and 211 in this example). In this example, access lines 242 and 243 can be called unselected access lines (e.g., unselected word lines), which are the access lines associated with (e.g., coupled to) unselected memory cells (e.g., memory cells 212, 213, 214, and 215 in this example).

In FIG. 4, voltages V1, V2, and V3 can represent different voltages applied to respective access lines 241, 242, and 243 and data lines 221 and 222 during a read operation of memory device 200. Voltage V1 can be applied to the selected access line (e.g., access line 241). In a read operation, voltage V2 can be applied to the unselected access lines (e.g., access lines 242 and 243).

Voltages V1, V2, and V3 can have different values. As an example, voltages V1, V2, and V3 can have values 3V, 0V, and 0.5V, respectively. The specific values of voltages used in this description are only example values. Different values may be used. Connection 297 can be applied with a voltage or can be coupled to ground.

In the read operation shown in FIG. 4, voltage V1 can have a value (voltage value) to turn on transistor T of each of memory cells 210 and 211 (selected memory cells in this example). This allows the memory elements 202 of memory cells 210 and 211 to couple to data lines 221 and 222, respectively, through transistors T of memory cells 210 and 211, respectively. Voltage V2 can have a value, such that transistor T of each of memory cells 212 through 215 (unselected memory cells in this example) are turned off (e.g., kept off). Voltage V3 can have a value, such that a current (e.g., read current) may be formed on a read path that includes data line 221 and transistor T of memory cell 210, and a read path (a separate read path) that includes data line 222 and transistor T of memory cell 212. This allows a detection of current on the read paths (e.g., on respective data lines 221 and 222) coupled to memory cells 210 and 211, respectively. A detection circuitry (not shown) of memory device 200 can operate to translate the value of the detected current (during reading of information from the selected memory cells) into the value (e.g., "0", "1", or a combination of multi-bit values) of information read from the selected memory cell. In the example of FIG. 4, the value of the detected currents on data lines 221 and 222 can be translated into the values of information read from memory cells 210 and 211, respectively.

Figure 5:
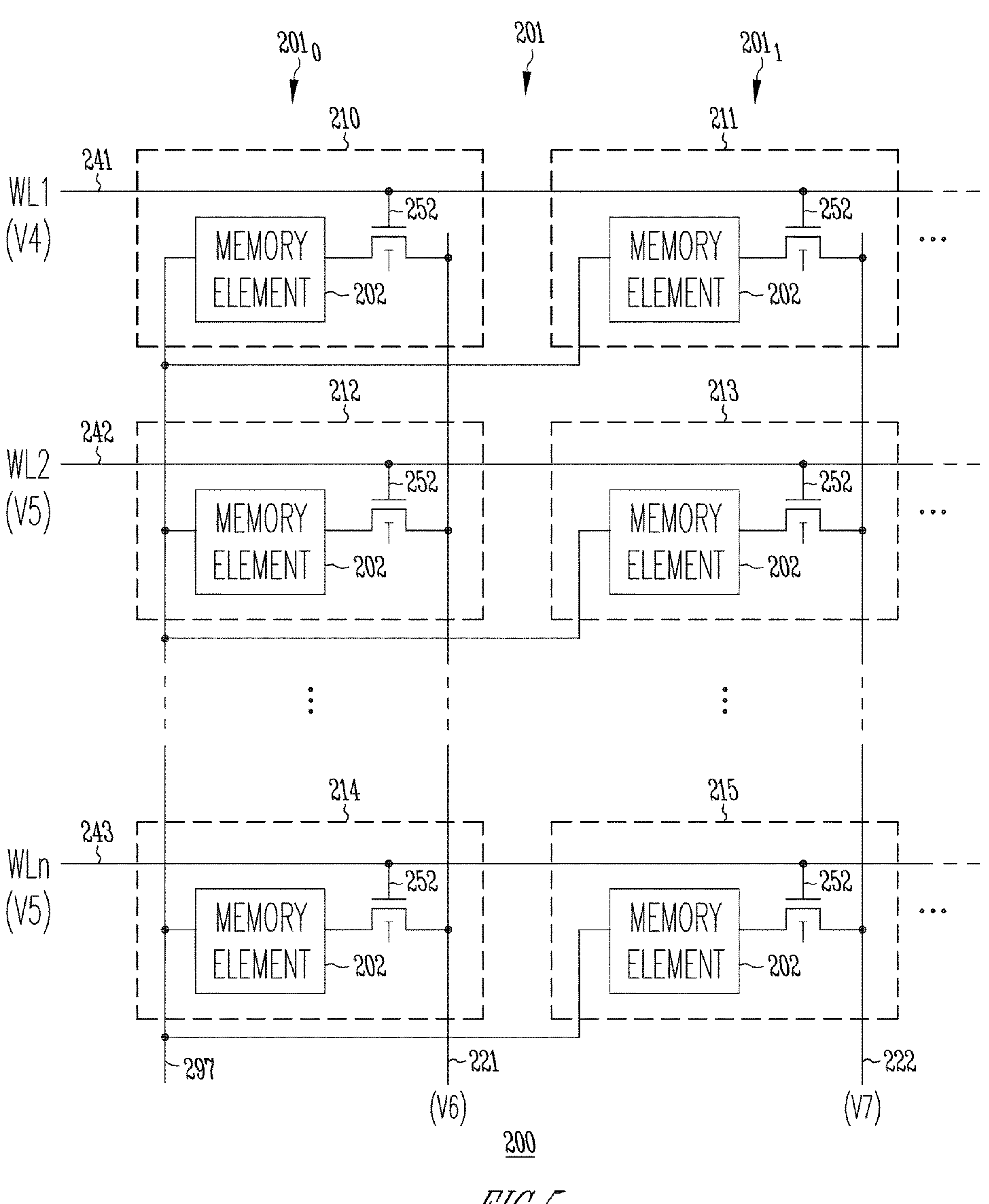
FIG. 5 shows the memory device of FIG. 2, including example voltages used during a write operation of the memory device, according to some embodiments described herein.

FIG. 5 shows memory device 200 of FIG. 2 including example voltages V4, V5, V6, and V7 used during a write operation of memory device 200, according to some embodiments described herein. The example of FIG. 5 assumes that memory cells 210 and 211 are selected memory cells (e.g., target memory cells) during a write operation to store information in memory cells 210 and 211. Memory cells 212 through 215 are assumed to be unselected memory cells. This means that memory cells 212 through 215 are not accessed and information is not to be stored in memory cells 212 through 215 while information is stored in memory cells 210 and 211 in the example of FIG. 5.

In FIG. 5, voltages V4, V5, V6, and V7 can represent different voltages applied to respective access lines 241, 242, and 243 and data lines 221 and 222 during a write operation of memory device 200. In a write operation, voltage V4 can be applied to the selected access line (e.g., access line 241). Voltage V5 can be applied to the unselected access lines (e.g., access lines 242 and 243).

Voltages V4, V5, V6, and V7 can have different values. As an example, voltages V4 and V5 can have values of 3V and 0V, respectively. These values are example values. Different values may be used. Connection 297 can be applied with a voltage or can be coupled to ground.

In the write operation shown in FIG. 5, voltage V4 can have a value (voltage value) to turn on transistor T of each of memory cells 210 and 211 (selected memory cells in this example). This allows the memory elements 202 of memory cells 210 and 211 to couple to data lines 221 and 222, respectively, through transistors T of memory cells 210 and 211, respectively. Voltage V5 can have a value, such that transistor T of each of memory cells 212 through 215 (unselected memory cells in this example) are turned off (e.g., kept off).

The values of voltages V6 and V7 can be the same or different depending on the value (e.g., "0" or "1") of information to be stored in memory cells 210 and 211. For example, the values of voltages V6 and V7 can be the same (e.g., V6=V7) if the memory cells 210 and 211 are to store information having the same value. As an example, V6=V7=0V if information to be stored in each memory cell 210 and 211 is "0". In another example, V6=V7=V+(e.g., V+ is a positive voltage (e.g., from 1V to 3V)) if information to be stored in each memory cell 210 and 211 is "1".

In another example, the values of voltages V6 and V7 can be different (e.g., V6≠V7) if the memory cells 210 and 211 are to store information having different values. As an example, V6=0V if "0" is to be stored in memory cell 210, and V7=V+(e.g., V+ is a positive voltage (e.g., from 1V to 3V)) if "1" is to be stored in memory cell 211. As another example, V6=V+(e.g., V+ is a positive voltage (e.g., from 1V to 3V)) if "1" is to be stored in memory cell 210, and V7=0V if "0" is to be stored in memory cell 211. The range of voltage of 1V to 3V is used here as an example. A different range of voltages can be used.

The structure of memory device 200 described above with reference to FIG. 2 through FIG. 5 is described below with reference to FIG. 6A through FIG. 7F.

For simplicity, detailed description of the same elements of memory device 200 is not repeated in the description of FIG. 6A through FIG. 7F. Some of the memory cells and associated data lines and access lines of memory device 200 schematically shown in FIG. 2 are not shown in FIG. 6A through FIG. 7F. FIG. 6A through FIG. 7F also show some of the memory cells and associated data lines and access lines of memory device 200 that are not schematically shown in FIG. 2. For simplicity and ease of viewing, cross-sectional lines (e.g., hatch lines) are omitted from most of the elements shown in FIG. 6A through FIG. 7F and other figures described herein. Some elements of memory device 200 may be omitted from a particular figure of the drawings so as to not obscure the description of the element (or elements) being described in that particular figure. The dimensions (e.g., physical structures) of the elements shown in the drawings described herein are not scaled.

Figure 6A:
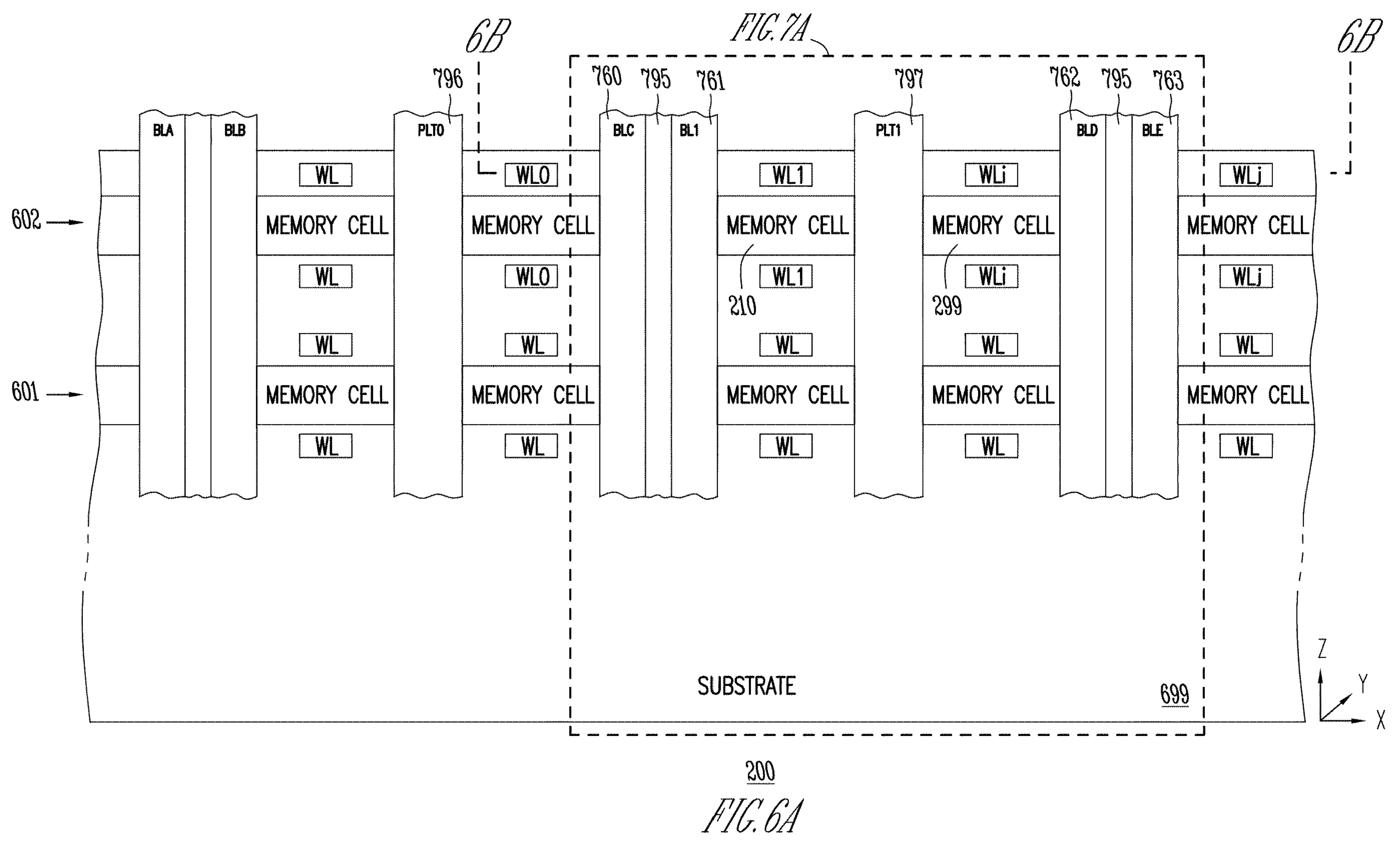
FIG. 6A through FIG. 7F show different views of a structure of the memory device of FIG. 2 through FIG. 5 including multiple tiers of memory cells, according to some embodiments described herein.

FIG. 6A shows a structure of memory device 200 including a substrate 699 and tiers 601 and 602 located (e.g., stacked) one over another over substrate 699, according to some embodiments described herein. FIG. 6A shows two tiers 601 and 602 of memory device 200 as an example. However, memory device 200 includes numerous tiers (e.g., up to 100 tiers or more than 100 tiers).

Figure 6B:
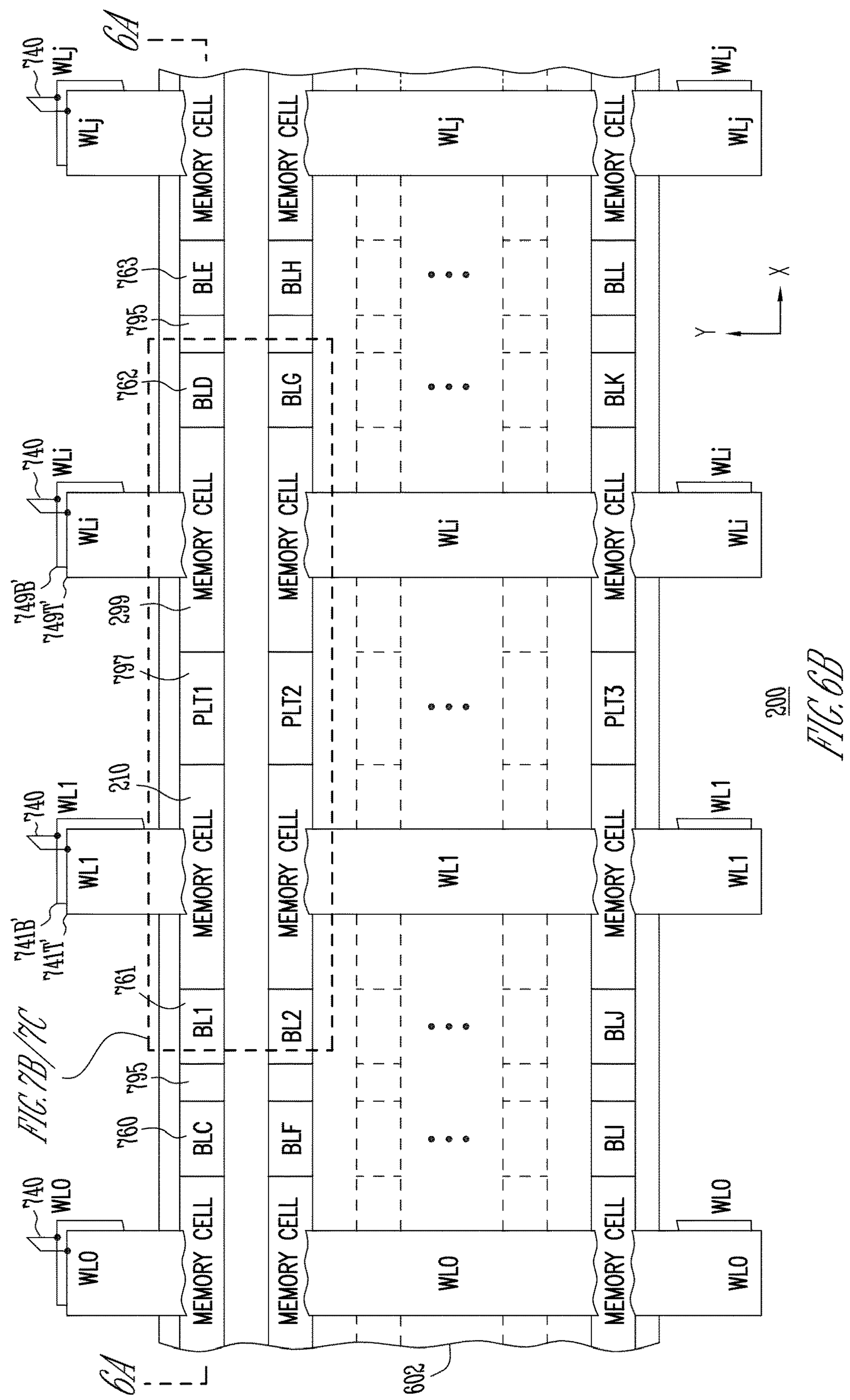

The X, Y, and Z directions shown in FIG. 6A can represent the directions corresponding to a three-dimensional (3D) structure of memory device 200. For simplicity, FIG. 6A only shows the portion of memory device 200 with respect to the X-Z direction. The Z-direction (e.g., vertical direction) is a direction perpendicular to (e.g., outward from) substrate 699. The Z-direction is also perpendicular to (e.g., extended vertically from) the X-direction and the Y-direction. The X-direction and Y-direction are perpendicular to each other. A top view of memory device 200 in the X-Y directions (e.g., X-Y plan view) along line 6B-6B is shown in FIG. 6B. A portion labeled "FIG. 7A" in FIG. 6A is shown in detail in FIG. 7A.

In FIG. 6A, substrate 699 can be a semiconductor substrate (e.g., silicon-based substrate) or other type of substrate. As shown in FIG. 6A, each of tiers 601 and 602 can have its own memory cells (labeled "MEMORY CELL"). Thus, tiers 601 and 602 can be called memory cell tiers 601 and 602.

Each of tiers 601 and 602 can include its own access lines associated with the memory cells in the same tier. FIG. 6A shows access lines associated with signals WL0, WL1, WLi, WLj, and WL (also called "the access lines"). Memory cells of different tiers (e.g., tiers 601 and 602) may not share access lines. For example, the memory cells of tier 601 may not share access lines with the memory cells of tier 602. As shown in FIG. 6A, each memory cell can be between and adjacent to (e.g., associated with) two respective portions of the access lines (e.g., a top and bottom access lines). For example, memory cell 210 can be associated with two respective portions of the access lines associated with signals WL1. In another example, memory cell 299 can be associated with two respective portions of the access lines associated with signals WLi. Memory cell 299 is not schematically shown in FIG. 2.

As shown in FIG. 6A, memory device 200 can include data lines associated with signals BLA, BLB, BLC, BL1, BLD, and BLE (also called "the data lines" or data lines BLA, BLB, BLC, BL1, BLD, and BLE). A data line associated with signal BL1 can correspond to data line 221 (associated signal BL1) of FIG. 2. Each of the data lines can include a conductive structure. For simplicity, only conductive structures 760, 761, 762, and 763 of the data lines associated with signals BLC, BL1, BLD, and BLE are labeled in FIG. 6A. As shown in FIG. 6A, each of the data lines can have a length extending through the tiers (through tiers 601 and 602) in the Z-direction, which is a direction perpendicular to substrate 699. As shown in FIG. 6A, the Z-direction is also a direction from one tier to another tier (e.g., one horizontal tier to another horizontal tier). Thus, each of the data lines (and their respective conductive structures) of memory device 200 can have length in a direction from one tier to another tier (e.g., one horizontal tier to another horizontal tier).

Memory device 200 can include a dielectric portion (which includes a dielectric material) 795 between adjacent data lines (e.g., adjacent data lines BLC and BL1 and adjacent data lines BLD and BLE). FIG. 6A shows six data lines BLA, BLB, BLC, BL1, BLD, and BLE as an example. The number of data lines of memory device 200 can vary.

As shown in FIG. 6A, memory device 200 can also include conductive lines (e.g., common conductive lines) associated with signals PLT0 and PLT1 (also called "the conductive lines"). Each of these conductive lines can include a respective conductive structure such as conductive structures 796 and 797. Each of conductive structures 796 and 797 can include a conductive material (e.g., conductively doped polysilicon, metal, or other conductive materials). Each of conductive structures 796 and 797 can be a common conductive structure between adjacent memory cells in the Y-direction (FIG. 6A) of different tiers (e.g., tiers 601 and 602) and between adjacent memory cells in the X-direction (FIG. 6B) of the same tier (e.g., tier 602). Each of conductive structures 796 and 797 of a respective conductive line (e.g., conductive line associated with signal PLT0 or PLT1) can be coupled to (or can be part of) connection 297 of memory device 200. In an operation of memory device, signals PLT0 and PLT1 can be provided a voltage or can be coupled to ground potential. As shown in FIG. 6A, like data lines BLA, BLB, BLC, BL1, BLD, and BLE, conductive structure 797 of each of the conductive lines (associated with signals PLT0 and PLT1) can have a length extending through the tiers (through tiers 601 and 602) in the Z-direction.

FIG. 6B shows a top view (e.g., a cross-section) of the structure of memory device 200 along line 6B-6B of FIG. 6A including a portion of tier 602 of FIG. 6A. For simplicity, only some of the memory cells of tier 602 and some of other data lines (e.g., data lines associated with signals BLF, BLG, BLH, BLI, BLJ, BLK, and BLL) of memory device 200 are shown in FIG. 6B. FIG. 6B also shows a top view of some memory cells of memory device 200 that are not shown in FIG. 6A. FIG. 6B also shows a top view of other conductive lines (e.g., common conductive lines) associated with signals PLT2 and PLT3. A side view of memory device 200 along line 6A-6A is shown in FIG. 6A (described above). A portion labeled "FIG. 7B/7C" in FIG. 6B is shown in detail in FIG. 7B (top view) and FIG. 7C (top view), respectively.

In FIG. 6B, the access lines associated with signals WL0, WL1, WLi, and WLj are shown in partial cut-away top view to show some portions of the memory cells underlying these access lines. As shown in FIG. 6B, each of the access lines associated with signals WL0, WL1, WLi, and WLj can be a separate strip (e.g., region of conductive material) having length in the Y-direction, which is perpendicular to the direction (e.g., the X-direction) from one memory cell to the next in the X-direction of the same tier (e.g., tier 602). The access lines associated with signals WL0, WL1, WLi, and WLj can be separated (electrically separated) from each other in the X-direction. As shown in FIG. 6B, the memory cells of the same tier (e.g., tier 602) can be arranged (spaced apart from each other) in the X-direction and arranged (spaced apart from each other) in the Y-direction. The memory cells (e.g., neighbor memory cells) in the X-direction may not share an access line (e.g., may not share a word line). For example, as shown in FIG. 6B, memory cell 210 (associated with the access line associated with signal WL1), which is a neighbor of (e.g., adjacent) memory cell 299 and is located at a distance from memory cell 299 in the X-direction, may not share the access line associated with signal WL1 with memory cell 299 in the X-direction.

As shown in FIG. 6B, each memory cell can be adjacent and between two conductive structures (e.g., top and bottom conductive structures) of an access line. For example, the access line associated with signal WL1 can include a conductive structure (e.g., top conductive structure) 741T' and a conductive structure (e.g., bottom conductive structure) 741B'. Conductive structures 741T' and 741B' can be part of access line 241 (FIG. 2) of memory device 200. Conductive structures 741T' and 741B' are opposite from each other in the Z-direction. Conductive structure 741T' can be located over (e.g., on top of) memory cell 210 with respect to the top view (with respect to the Z-direction shown in FIG. 6A). Conductive structure 741B' can be located under (e.g., below) memory cell 210 with respect to the top view (with respect to the Z-direction shown in FIG. 6A). As shown in FIG. 6B, each of conductive structure 741T' and 741B' can be structured as a strip (e.g., a region) of conductive material electrically separated from adjacent conductive structures of other access lines (e.g., access lines associated with signals WL0, WLi, and WLj).

Other access lines (e.g., access lines associated with signals WL0, WLi, and WLj) of memory device 200 have similar structures as the access lines associated with signal WL1. For example, as shown in FIG. 6B, the access line associated with signal WLi can include a conductive structure (e.g., top conductive structure) 749T' and a conductive structure (e.g., bottom conductive structure) 749B'. Conductive structures 749T' and 749B' can be part of an access line associated with memory cell 299. Conductive structures 749T' and 749B' are opposite from each other in the Z-direction. Conductive structure 749T' can be located over (e.g., on top) of memory cell 210 with respect to the top view (with respect to the Z-direction shown in FIG. 6A). Conductive structure 749B' can be located under (e.g., below) memory cell 210 with respect to the top view (with respect to the Z-direction shown in FIG. 6A). As shown in FIG. 6B, each of conductive structure 749T' and 749B' can be structured as a strip (e.g., a region) of conductive material electrically separated from adjacent conductive structures of other access lines (e.g., access lines associated with signals WL0, WLi, and WLj).

In the example of FIG. 6B, conductive structures 741T' and 741B' can be electrically coupled to each other by a connection 740. Connection 740 can include a conductive connection (which can include a conductive material (e.g., metal)). As shown in FIG. 6B, each of the other access lines (e.g., the access lines associated with signals WL0, WLi, and WLj) can also include top and bottom conductive structures, in which the top and bottom conductive structures can also be electrically coupled to each other by a respective connection 740.

Figure 7A:
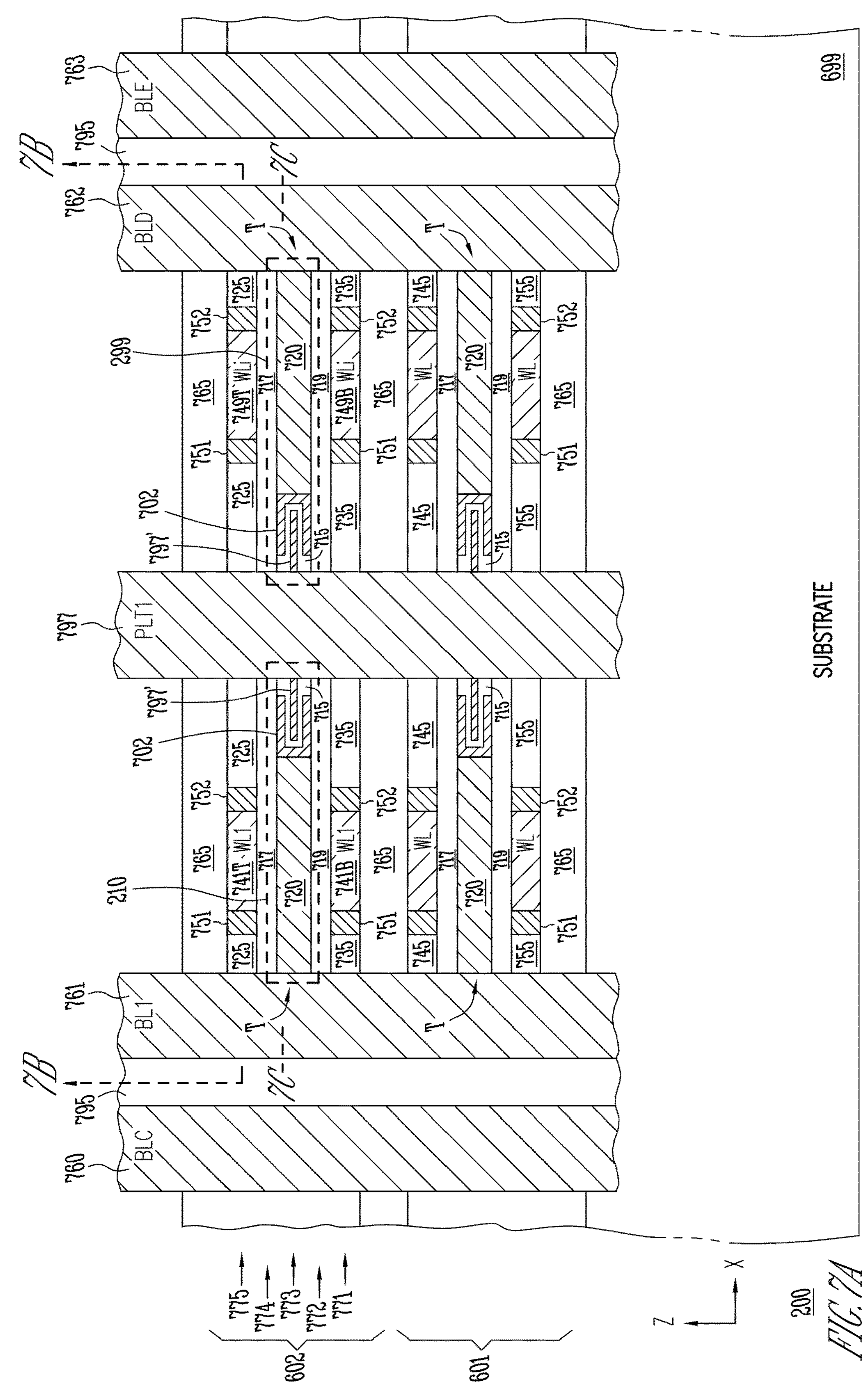
Figures 7B, 7C:
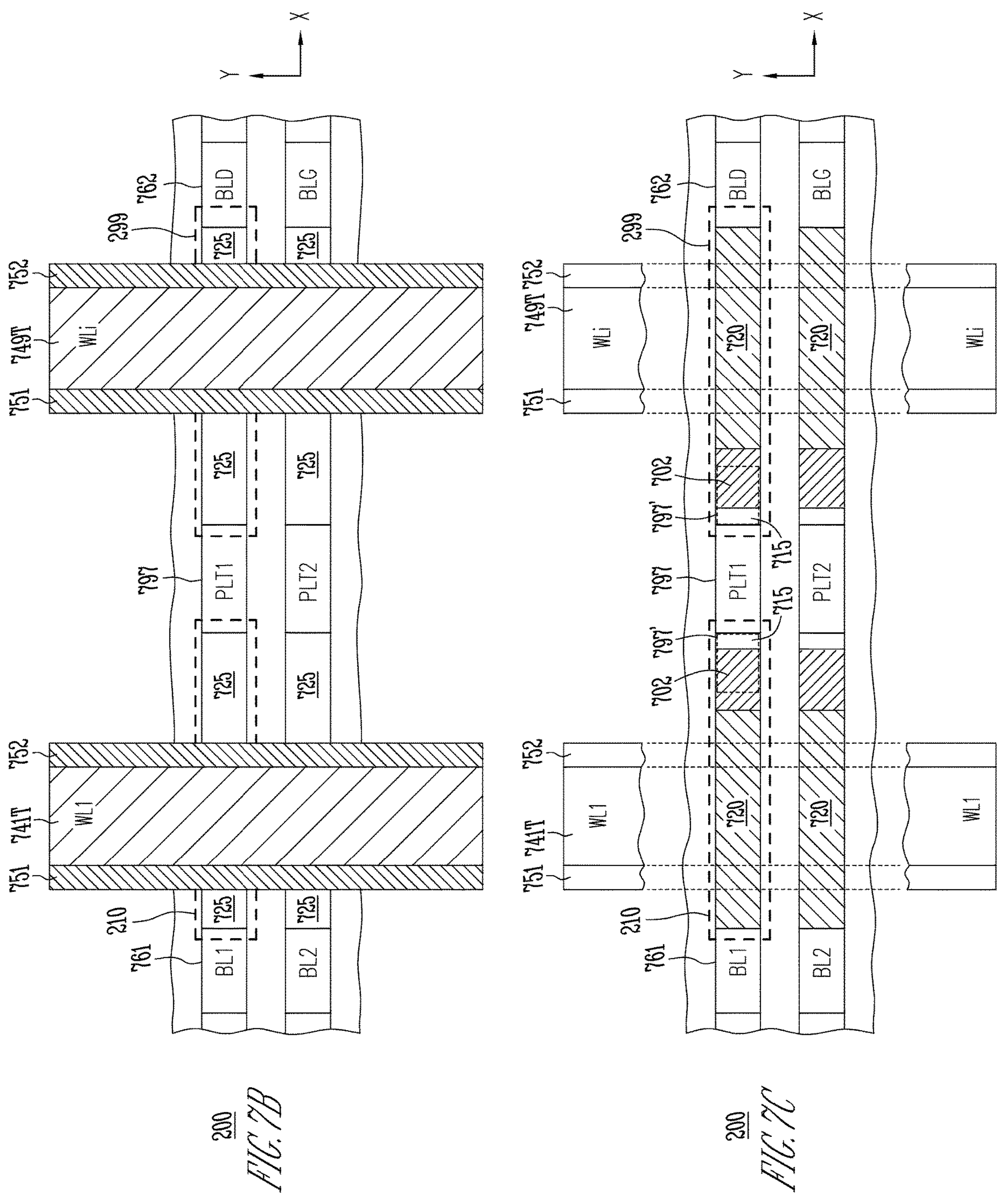
Figures 7D, 7E, 7F:
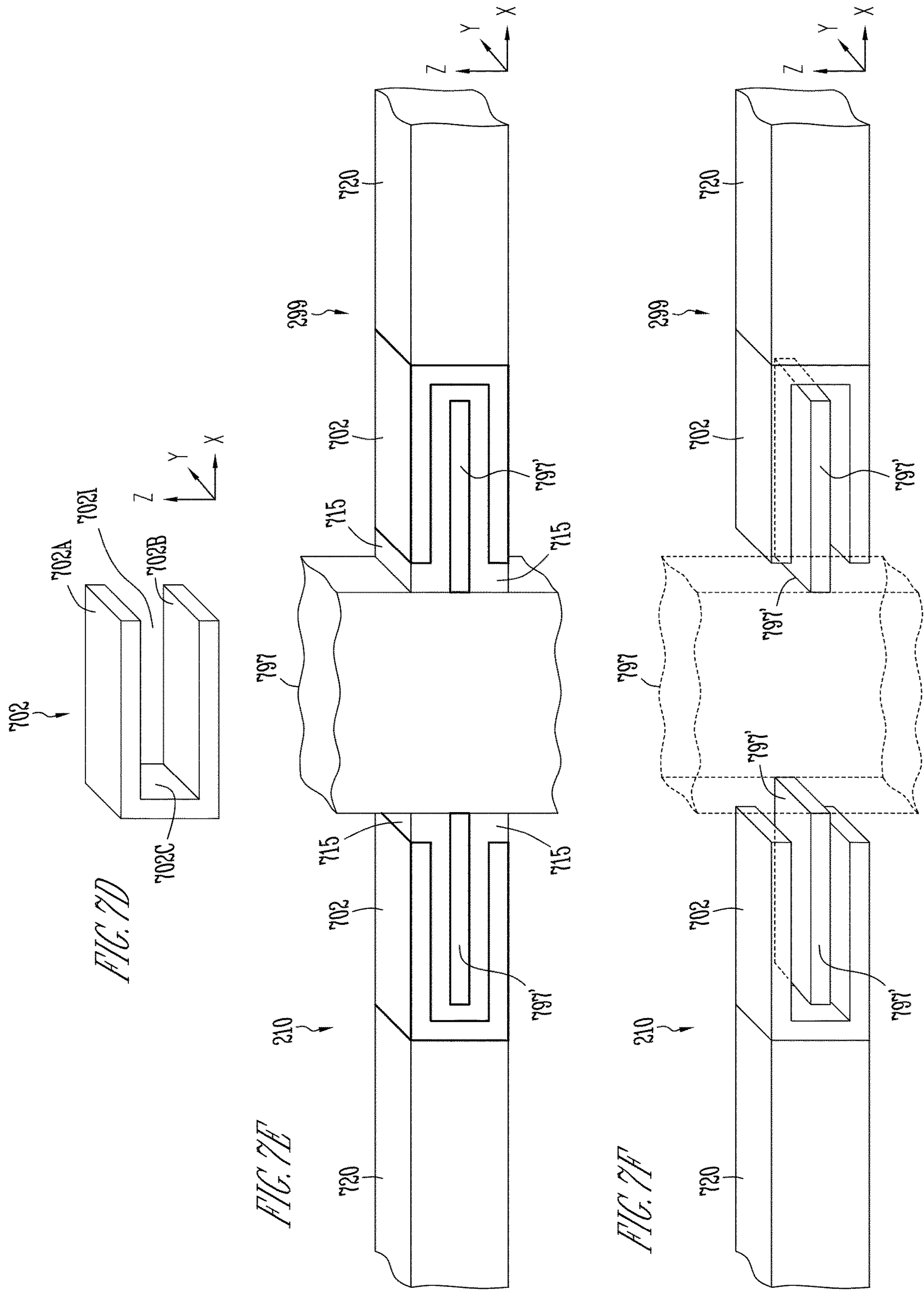

FIG. 7A shows a side view (e.g., a cross-section) of the portion labeled "FIG. 7A" of memory device 200 in FIG. 6A. FIG. 7B shows a top view of a portion of memory device 200 along line 7B-7B of FIG. 7A and the portion labeled "FIG. 7B/7C" in FIG. 6B. FIG. 7C shows a top view of a portion of memory device 200 along line 7C-7C of FIG. 7A and the portion labeled "FIG. 7B/7C" in FIG. 6B. FIG. 7D shows a 3D view of a charge storage structure 702 of memory device 200. FIG. 7E shows a 3D view of a portion of memory device 200 including a conductive portion 797' coupled to conductive structure 797 and extending into an interior region of charge storage structure 702. FIG. 7F shows the same view as FIG. 7E. However, for further ease of viewing the elements shown in FIG. 7E, FIG. 7F omits dielectric material (dielectric portion) 715 and shows conductive structure 797 in dashed line.

In FIG. 7A, FIG. 7B, FIG. 7C, FIG. 7D, FIG. 7E, and FIG. 7F, the same elements of memory cells 210 and 299 and other elements of memory device 200 are given the same labels. Thus, for simplicity, descriptions for the elements of memory cells 210 and 299 and other elements in FIG. 7A also refer to the same elements shown in FIG. 7B, FIG. 7C, FIG. 7D, FIG. 7E, and FIG. 7F. Therefore, some of the elements in FIG. 7B, FIG. 7C, FIG. 7D, FIG. 7D, FIG. 7E, and FIG. 7F are not described separately.

FIG. 7A shows details of cross-sections of tiers 601 and 602 of memory device 200. As shown in FIG. 7A, each of tiers 601 and 602 can have different levels (physical levels) located (stacked) one over another in the Z-direction over substrate 699. For example, tier 602 can include levels 771 through 775. For simplicity, the levels in tier 601 are not labeled.

Each of the data lines (associated with signals BLC, BL1, BLD, and BLE) can be formed from (e.g., can include) a conductive structure. FIG. 7A shows conductive structures 760, 761, 762, and 763 of data lines associated with signals BLC, BL1, BLD, and BLE, respectively. Each of conductive structures 760, 761, 762, and 763 can include a conductive material (e.g., conductively doped polysilicon, metal, or other conductive materials). As shown in FIG. 7A, each of conductive structures 760, 761, 762, and 763 can have a length extending through the tiers (through tiers 601 and 602) in the Z-direction, which is a direction perpendicular to substrate 699.

Conductive structures 760, 761, 762, and 763 can be electrically coupled to some of the elements (e.g., the channel region of transistor T, described below) of respective memory cells (e.g., memory cell 210 and 299) among the memory cells of tier 602.

Each of conductive structures 760, 761, 762, and 763 are electrically separated from the access lines (e.g., access lines associated with signals WL1, WLi, and WL) of memory device 200 by respective dielectric portions (e.g., dielectric portions 725, 735, 745, and 755).

For simplicity, the description of FIG. 7A describes the elements of tier 602. Tier 601 can have similar elements (which have similar or the same labels) as the elements of memory cell 210.

In FIG. 7A, conductive regions 741T, 751, and 752 on level 775 are part of conductive structure 741T' (labeled in FIG. 6B). In FIG. 7A, conductive regions 741B, 751, and 752 on level 771 are part of conductive structure 741B' (labeled in FIG. 6B).

As shown in FIG. 7A, conductive region (e.g., top conductive region) 741T is adjacent (e.g., directly coupled to) and between conductive regions 751 and 752 on level 775 and is located on the same level (e.g., level 775) as conductive regions 751 and 752 on level 775. Conductive region (e.g., bottom conductive region) 741B is adjacent (e.g., directly coupled to) and between conductive regions 751 and 752 on level 771 and is located on the same level (e.g., level 771) as conductive regions 751 and 752 on level 771.

Each of conductive regions 741T and 741B can include a material that has a different work function from the work function of the material of each of conductive regions 751 and 752. For example, each of conductive regions 741T and 741B can include a material that has a higher work function from the work function of the material of each of conductive regions 751 and 752.

The work function of the material of conductive region 741T can be the same as the work function of the material of conductive region 741B. The work function of the material of conductive region 751 can be the same work function as the material of conductive region 752.

Conductive region 741T can have a material that is different from the material of conductive region 751 and the material of conductive region 752. The material of conductive region 751 can be the same as the material of conductive region 752. The material of conductive region 741T can be the same as the material of conductive region 741B.

In an example, conductive regions 741T and 741B can include metal. In an example, each of conductive regions 741T and 741B can include at least one of titanium nitride, tungsten, molybdenum, ruthenium, and titanium. These materials (e.g., metal) of conductive regions 741T and 741B described herein are examples. Other conductive materials (e.g., other metal materials) can be used. In an example, each of conductive regions 751 and 752 can include conductively doped polysilicon. In an example, the conductively doped polysilicon can have an N-type conductivity (e.g., N+ polysilicon). In another example, each of conductive regions 751 and 752 can include metal, which is different from the metal of conductive regions 741T and 741B. For example, each of conductive regions 751 and 752 can include lanthanum-doped metal (or lanthanum-doped metals) that has a lower work function than the material (e.g., metal) of each of conductive regions 741T and 741B.

Thus, as described here, each of conductive regions 751 and 752 can have a material (e.g., metal) that has a work function different from (e.g., greater than) the work function of the material (e.g., conductively doped polysilicon or lanthanum-doped metal) of each of conductive regions 751 and 752. For example, each of conductive regions 741T and 741B can include metal and each of conductive regions 751 and 752 can include conductively doped polysilicon (e.g., N+ polysilicon). In another example, each of conductive regions 741T and 741B can include metal and each of conductive regions 751 and 752 can also include metal. However, the metal of each of conductive regions 751 and 752 can have a lower work function than the metal of each of conductive regions 741T and 741B.

As shown in FIG. 7A, conductive region 751 adjacent conductive region 741T can be electrically separated from conductive structure 761 of the data line associated with signal BL1 and conductive structure 797 of the conductive line (e.g., common conductive line) associated with signal PLT1 by respective dielectric portions 725. Conductive region 752 adjacent conductive region 741B is electrically separated from conductive structures 761 and 797 by respective dielectric portions 735.

In FIG. 7A, conductive regions 749T, 751, and 752 on level 775 are part of conductive structure 749T' (e.g., top conductive structure labeled and shown in FIG. 6B). In FIG. 7A, conductive regions 749B, 751, and 752 on level 771 are part of conductive structure 749B' (e.g., bottom conductive structure labeled and shown in FIG. 6B).

As shown in FIG. 7A, conductive region (e.g., top conductive region) 749T is adjacent (e.g., directly coupled to) and between conductive regions 751 and 752 on level 775 and is located on the same level (e.g., level 775) as conductive regions 751 and 752 on level 775. Conductive region (e.g., bottom conductive region) 749B is adjacent (e.g., directly coupled to) and between conductive regions 751 and 752 on level 771 and is located on the same level (e.g., level 771) as conductive regions 751 and 752 on level 771. The materials of conductive regions 749T and 749B can be the same as the materials of conductive regions 741T and 741B.

In memory device 200, adjacent memory cells in the X-direction may not share an access line (e.g., a word line) or access lines. For example, memory cells 210 and 299 may not share an access line or access lines. Thus, conductive regions 741T and 749T (which are located on the same level 775) can be electrically separated from each other. For example, as shown in FIG. 7A, conductive regions 741T and 749T are not formed from (e.g., are not included in) the same piece of conductive material. Similarly, conductive regions 741B and 749B (which are located on the same level 771) can be electrically separated from each other. For example, conductive regions 741B and 749B are not formed from (e.g., are not included in) the same piece of conductive material. In another example, as shown in FIG. 7A, conductive regions 751 and 752 associated with memory cell 210 can be electrically separated from respective conductive regions 751 and 752 associated with memory cell 299.

As shown in FIG. 7A, memory device 200 can include different dielectric portions located on different levels in the Z-direction to electrically separate the elements (in the Z-direction) within the same tier and to electrically separate one tier from another tier. For example, as shown in FIG. 7A, memory device 200 can include dielectric portions 717 and 719 located on levels 774 and 772, respectively. Dielectric portions 717 and 719 can electrically separate (in the Z-direction) elements within tier 602. Memory device 200 can include dielectric portions 765 that can electrically separate (in the Z-direction) one tier from another tier.

Dielectric portions 717, 719, and 765 can have the same dielectric material or different dielectric materials. Example materials for dielectric portions 717, 719, and 765 include silicon oxide, silicon nitride, hafnium oxide (e.g., $HfO_2$), aluminum oxide (e.g., $Al_2O_3$), or other dielectric materials (e.g., other high-k dielectric materials).

As shown in FIG. 7A, charge storage structure 702 and a material 720 can be located on level 773. Material 720 can also be called portion 720. Material 720 is adjacent (e.g., contacts) charge storage structure 702 and is electrically coupled to charge storage structure 702. Material 720 can also be electrically coupled to a respective conductive structure (e.g., conductive structure 761 or 762) of a respective data line (e.g., data line associated with signal BL1 or BLD). As shown in FIG. 7A, each of memory cells 210 and 299 (and two other memory cells located below memory cells 210 and 299) of memory device 200 can include transistor T. Material 720 can form part of a channel region (e.g., write channel region) of transistor T of a respective memory cell (e.g., memory cell 210 or 299).

Material 720 (also called portion 720) of a particular memory cell (e.g., memory cell 210) can form a source (e.g., source terminal), a drain (e.g., drain terminal), or a channel region (e.g., write channel region) between the source and the drain of transistor T of that particular memory cell (e.g., memory cell 210). For example, as shown in FIG. 7A, the source, channel region, and the drain of transistor T of memory cell 210 can be formed from a single piece of the same material (or alternatively, a single piece of the same combination of materials) such as material 720. Therefore, the source, the drain, and the channel region of transistor T of memory cell 210 can be formed from the same material (e.g., material 720) of the same conductivity type (e.g., either n-type or p-type).

Material 720 (e.g., the write channel region of transistor T) of a particular memory cell (e.g., memory cell 210) of memory device 200 can be part of a read path (e.g., in a read operation) or a write path (e.g., in a write operation) of that particular memory cell. Materials 720 (portion 720) can include a structure (e.g., a piece (e.g., a layer)) of semiconductor material. In the example where transistor T is an NFET (as described above), material 720 can include n-type semiconductor material (e.g., n-type silicon). In an example, the semiconductor material of portion 720 can include graded doping regions such that the semiconductor material of portion 720 can have different regions (e.g., different silicon regions) with different doping concentrations. One of such regions (e.g., a middle region) of the semiconductor material can be undoped (e.g., undoped silicon or undoped polysilicon).

As shown in FIG. 7A, charge storage structure 702 is adjacent (e.g., contacts) material 720 and electrically coupled to material 720. Charge storage structure 702 can correspond to (or can be part of) memory element 202 of memory device 200 that is schematically shown in FIG. 2. As shown in FIG. 7A, charge storage structure 702 is electrically separated from conductive structure 797 of a respective conductive line (e.g., the conductive line associated with signal PLT1) by dielectric portion (dielectric material) 715. Charge storage structure 702 can include a charge storage material (or a combination of materials), which can include a piece (e.g., a layer) of semiconductor material (e.g., polysilicon), a piece (e.g., a layer) of metal, or a piece of material (or materials) that can trap charge. The materials for charge storage structure 702 and conductive regions 741T, 741B, 749T, and 749B can be the same or can be different.

As shown in FIG. 7D, charge storage structure 702 can have multiple portions that include portions 702A and 702B (e.g., horizontal portions) and a portion (e.g., vertical portion) 702C. Portions 702A, 702B, and 702C can form a U-shape structure and can have an interior region 702I. Interior region 702I is bordered (e.g., partially surrounded by) portions 702A, 702B, and 702C such that interior region 702I is void of the material (conductive material) of charge storage structure 702 (e.g., void of the material of portions 702A, 702B, and 702C).

As shown in FIG. 7D, portions 702A and 702B (e.g., the longer portions of the U-shape structure) can be opposite from each other in the Z-direction, which is also perpendicular to the direction from memory cell 210 to memory cell 299 or a direction parallel to a direction from one tier (e.g., tier 601 in FIG. 7A) to another tier (e.g., tier 602 in FIG. 7A). Portion 702C (e.g., the shorter portion of the U-shape structure) joins (is connected to) portions 702A and 702C.

As shown in FIG. 7A and FIG. 7E, conductive portion 797' can be adjacent (e.g., contact) conductive structure 797 and electrically coupled to conductive structure 797. Conductive portion 797' can include a conductive material (e.g., conductively doped polysilicon, metal, or other conductive materials). The material of conductive portion 797' can be the same as or different from the material of conductive structures 796 and 797.

As shown in FIG. 7A and FIG. 7E, charge storage structure 702 can be separated (electrically separated) from conductive structure 797 and conductive portion 797' by dielectric material 715. Conductive portion 797' can have length in the X-direction, which is also a direction from conductive structure 797 to charge storage structure 702. As shown in FIG. 7A, FIG. 7D, and FIG. 7F, part of conductive portion 797' can extend into interior region 702I (labeled in FIG. 7D) and can be located (e.g., positioned) between portions 702A and 702B (labeled in FIG. 7D). Conductive portion 797' (FIG. 7E) is separated from portions 702A, 702B, and 702C by dielectric portion 715. Dielectric material 715 can include silicon dioxide, a high-k dielectric, or other dielectric materials. A high-k dielectric material is a dielectric material having a dielectric constant greater than a dielectric constant of silicon dioxide.

The structure of the memory cell (e.g., memory cell 210) of memory device 200, including the U-shape structure of charge storage structure 702, can provide enough charge storage capacity in the memory cell. Thus, leakage of current (e.g., current $I_{OFF}$) associated with transistor T (e.g., associated with portion 720) can be relatively relaxed. Therefore, the material of portion 720 may not be limited to a certain material (e.g., a relatively low current leakage material) but it can be selected from different materials (including silicon and polysilicon) as described above. This can allow memory device 200 to have an advantage (e.g., more selection of materials for portions 710 and 720) over some memory devices where the channel region of a transistor in the memory cell is limited to a certain material (e.g., material different from silicon and polysilicon).

As shown in FIG. 7A, the memory cells (e.g., memory cell 210, 299, and two memory cells (not labeled) located below memory cells 210 and 299) of memory device 200 have a similar or same structure. Thus, for simplicity, detailed description of memory cells 299 and other memory cells are omitted.

The shape (e.g., U-shape structure) of charge storage structure 702 and its arrangement with conductive portion 797' (as shown in FIG. 7A) can allow charge storage structure 702 to have a relatively high storage capacity (e.g., high capacitance). Thus, material 720 (e.g., write channel region of transistor T) may not be limited to a certain material but it can be selected from different materials (e.g., semiconductor material, semiconducting oxide materials, or other materials that can conduct current).

The structure of memory device 200, as described above, can have improvement in footprint (e.g., smaller lateral footprint) and cell density (e.g., smaller device's volume for a given number of memory cells) in comparison with some conventional memory devices (e.g., convention DRAM devices).

Further forming the conductive structure (e.g., conductive structure 741T' or 741B' in FIG. 6B) of an access line (e.g., word line) in which the conductive structure includes different conductive regions (e.g., conductive regions 741T, 751, and 752 in FIG. 7A) on the same level can also improve operation of memory device 200. For example, in an alternative structure of memory device 200, the conductive structure (e.g., conductive structure 741T') of the access line can include a single conductive region in each conductive structure (e.g., conductive region 741T in FIG. 7A without adjacent conductive regions 751 and 752). However, in such an alternative structure of memory device 200, current (e.g., $I_{ON}$ or $I_{OFF}$) associated with the memory cells of memory device 200 during a memory operation (e.g., read or write operation) of memory device 200 may be limited to a certain range. In memory device 200 as described above, forming the conductive structure having different conductive regions (e.g., conductive regions 741T, 751, and 752 in FIG. 7A) with different conductive materials having work functions can improve current (e.g., $I_{ON}$ or $I_{OFF}$) associated with the memory cells of memory device 200 during a memory operation (e.g., read or write operation) of memory device 200. For example, for the same value of current $I_{OFF}$, current $I_{ON}$ associated with the memory cells of memory device 200 can be higher than that of current $I_{ON}$ associated with the memory cells of the alternative structure (e.g., single conductive region, mentioned above) of memory device 200. A higher current $I_{ON}$ can improve memory operation of memory device 200.

The description above with reference to FIG. 6A through FIG. 7F shows that the elements (e.g., the memory cells and the access lines) can be arranged (e.g., formed) in different tiers of memory device 200. This can allow multiple tiers (e.g., tiers 601 and 602 and similar tiers) of memory device 200 to be formed together. Thus, the cost (e.g., cost per bit) of forming memory device 200 can be reduced. Further, the length of the conductive structures of the data lines can be based on the number of tiers. The tier structure and the memory cell structure of the memory cells of memory device 200 (as shown in FIG. 7A) can have a relatively compact size (e.g., including a relatively small (e.g., thin) dimension in the Z-direction of each memory cell). This can improve (e.g., increase) area efficiency of the memory device in comparison with some similar memory devices. The compact size (e.g., relatively small memory cell dimension in the Z-direction) can also improve (e.g., shorten) the length (e.g., vertical length in Z-direction) of the data lines of memory device 200. This can reduce coupling capacitance between data lines of memory device 200 and total capacitance of the data lines. Reduction of these capacitances can lead to improved operations of memory device 200. Further, an access line having different conductive regions with different work functions (e.g., conductive regions 741T, 751, and 752 of conductive structure 741T') can improve the current associated with the memory cells of memory device 200 during a memory operation (e.g., read or write operation) of memory device 200.

The illustrations of apparatuses (e.g., memory devices 100 and 200) and methods (e.g., operations of memory devices 100 and 200) are intended to provide a general understanding of the structure of various embodiments and are not intended to provide a complete description of all the elements and features of apparatuses that might make use of the structures described herein. An apparatus herein refers to, for example, either a device (e.g., any of memory devices 100 and 200) or a system (e.g., an electronic item that can include any of memory devices 100 and 200).

Any of the components described above with reference to FIG. 1 through FIG. 7F can be implemented in a number of ways, including simulation via software. Thus, apparatuses (e.g., memory devices 100 and 200) or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100 and 200) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 7F include apparatuses in which one of the apparatuses includes a first conductive structure, a second conductive structure, a third conductive structure, and a memory cell. The memory cell includes a semiconductor portion located on a first level of the apparatus and coupled to the first conductive structure, and a charge storage structure located on the first level coupled to the semiconductor portion and separated from the second conductive structure. The third conductive structure is located on a second level of the apparatus adjacent the semiconductor portion, and including first, second, and third conductive regions. The third conductive region is located between the first and second conductive regions and has a material different from a material of the first conductive region and a material of the second conductive region.

Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

The term "adjacent" here generally refers to a position of a thing being next to (e.g., either immediately next to or close to with one or more things between them) or adjoining another thing (e.g., abutting it or contacting it (e.g., directly coupled to) it).

In the detailed description and the claims, the terms "first", "second", and "third," etc. are used merely as labels, and are not intended to impose numerical requirements on their objects.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:

a first conductive structure;

a second conductive structure;

a memory cell including:

a semiconductor portion located on a first level of the apparatus and coupled to the first conductive structure; and a charge storage structure located on the first level coupled to the semiconductor portion and separated from the second conductive structure; and a third conductive structure located on a second level of the apparatus adjacent the semiconductor portion, the third conductive structure including first, second, and third conductive regions, the third conductive region located between the first and second conductive regions and having a material different from a material of the first conductive region and a material of the second conductive region.

2. The apparatus of claim 1, wherein the material of the first conductive region and the material of the second conductive region are the same.

3. The apparatus of claim 1, wherein the material of the third conductive region includes metal.

4. The apparatus of claim 1, wherein the first and second conductive regions include conductively doped polysilicon.

5. The apparatus of claim 1, wherein:

the material of first conductive region includes first metal; and the material of third conductive region includes a second metal, wherein the second metal has a higher work function than the first metal.

6. The apparatus of claim 1, wherein:

the first conductive region is adjacent the first conductive structure and separated from the first conductive structure by a first dielectric material; and the second conductive region is adjacent the second conductive structure and separated from the second conductive structure by a second dielectric material.

7. The apparatus of claim 1, further comprising a conductive portion coupled to the second conductive structure, wherein:

the charge storage structure including a first portion, a second portion opposite the first portion, and a third portion joining the first and second portions; and part of the conductive portion is located between the first and second portions of the charge storage structure and separated from the first, second, and third portions of the charge storage structure by a first dielectric material.

8. The apparatus of claim 1, wherein the first conductive structure is part of a data line of the apparatus.

9. The apparatus of claim 1, wherein the second conductive structure is part of a ground connection of the apparatus.

10. The apparatus of claim 1, wherein the third conductive structure is part of a word line of the apparatus.

11. An apparatus comprising:

a data line including a first conductive structure having a length in a first direction;

a second conductive structure having a length in the first direction;

a memory cell coupled to the first and second conductive structures, the memory cell including:

a transistor including a channel region coupled to the first conductive structure, the channel region including a first side and a second side opposite the first side in the first direction; and a charge storage structure coupled to the channel region;

a first additional conductive structure located at the first side of the channel region and separated from the channel region by a first dielectric material, the first additional conductive structure having a length in a second direction; and a second additional conductive structure located at the second side of the channel region and separated from the channel region by a second dielectric material, the second conductive structure having a length in the second direction, wherein each of the first and second additional conductive structures includes first and second conductive regions having a same material and a third conductive region between the first and second conductive regions, wherein the third conductive region and the first conductive region have different materials.

12. The apparatus of claim 11, wherein the third conductive region includes at least one of titanium nitride, tungsten, molybdenum, ruthenium, and titanium.

13. The apparatus of claim 11, wherein the first and second conductive regions include at least one of conductively doped polysilicon of N-type conductivity and lanthanum-doped metal.

14. The apparatus of claim 11, wherein the first and second additional conductive structures are coupled to each other.

15. The apparatus of claim 11, wherein part of the third conductive region forms a gate of the transistor.

16. An apparatus comprising:

tiers located one over another, each tier including memory cells;

a first data line including a first conductive structure, a second data line including a second conductive structure, and a third conductive structure, the first, second, and third conductive structures extending through the tiers;

a first memory cell and a second memory cell included in the memory cells of one of the tiers, the first memory cell located at a distance from the second memory cell in a direction perpendicular to a direction from one tier to another tier, each of the first and second memory cells including:

a semiconductor portion located on a first level of the apparatus and coupled to one of the first and second conductive structures; and a charge storage structure located on the first level and coupled to the semiconductor portion and separated from the third conductive structure;

a fourth conductive structure located on a second level of the apparatus adjacent the semiconductor portion of the first memory cell; and a fifth conductive structure located on the second level of the apparatus adjacent the semiconductor portion of the second memory cell, wherein each of the fourth and fifth conductive structures includes first, second, and third conductive regions, the third conductive region located between the first and second conductive regions, and wherein a material of the third conductive region has a different work function from a material of each of the first and second conductive regions.

17. The apparatus of claim 16, wherein the work function of the third conductive region is higher than the work function of each of the first and second conductive regions.

18. The apparatus of claim 16, wherein the first and second conductive regions include conductively doped polysilicon of N-type.

19. The apparatus of claim 16, wherein the third conductive region includes metal.

20. The apparatus of claim 16, further comprising:

a first conductive portion coupled to the third conductive structure, the first conductive portion located adjacent the charge storage structure of the first memory cell and separated from the charge storage structure of the first memory cell by a first dielectric material; and a second conductive portion coupled to the third conductive structure, the second conductive portion located adjacent the charge storage structure of the second memory cell and separated from the charge storage structure of the second memory cell by a second dielectric material.

* * * * *